United States Patent
Lin et al.

(10) Patent No.: US 7,157,367 B2
(45) Date of Patent: Jan. 2, 2007

(54) DEVICE STRUCTURE HAVING ENHANCED SURFACE ADHESION AND FAILURE MODE ANALYSIS

(75) Inventors: Hway Chi Lin, Hsinchu (TW); Yi-Lung Cheng, Danshuei Township, Taipei County (TW); Chao-Hsiung Wang, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 139 days.

(21) Appl. No.: 10/861,149

(22) Filed: Jun. 4, 2004

(65) Prior Publication Data

US 2005/0272260 A1 Dec. 8, 2005

(51) Int. Cl.
*H01L 21/4763* (2006.01)

(52) U.S. Cl. ........................ 438/623; 257/759
(58) Field of Classification Search ............... 438/623, 438/627, 629, 653, 672, 675, 687; 257/753, 257/759
See application file for complete search history.

(56) References Cited

U.S. PATENT DOCUMENTS

| | | | | |
|---|---|---|---|---|
| 5,504,042 | A * | 4/1996 | Cho et al. ................. | 438/781 |
| 6,528,409 | B1 * | 3/2003 | Lopatin et al. ............ | 438/618 |
| 6,797,605 | B1 * | 9/2004 | Goh et al. ................. | 438/622 |
| 2002/0004300 | A1 * | 1/2002 | Plat et al. ................. | 438/665 |

* cited by examiner

*Primary Examiner*—David Vu
(74) *Attorney, Agent, or Firm*—Thomas, Kayden, Horstemeyer & Risley

(57) ABSTRACT

A substrate is provided having semiconductor device structures formed in and on the substrate. The semiconductor device structures comprise conductor layers embedded in openings in dielectric layers having a dielectric constant of less than 4.5. The dielectric layer has a roughness between the dielectric and the conductor wherein the roughness of the dielectric layer divided by the thickness of a barrier layer underlying the conductor layer is 0 to 1. The integrated circuit structure is prepared for failure analysis by removing the low dielectric constant dielectric layers and exposing the conductor layers for further failure analysis by optical examination or scanning electron microscope (SEM).

28 Claims, 3 Drawing Sheets

US 7,157,367 B2

DEVICE STRUCTURE HAVING ENHANCED SURFACE ADHESION AND FAILURE MODE ANALYSIS

BACKGROUND of the INVENTION

1. Field of Invention

This invention is directed to a method for failure mode analysis and more particularly to a method of removing a low dielectric constant material in preparation for failure mode analysis in the manufacture of integrated circuits.

2. Description of Related Art

In the manufacture of integrated circuits, failure mode analysis is an important tool for improving the manufacturing process. One important process is the fabrication of metal lines. In failure mode analysis of this process, it is necessary to check the surface of the metal film in order to check for voiding at the metal surface and it is also necessary to check the cross-section to check for voiding in the via hole. Copper damascene metallization has become very popular in integrated circuit fabrication. Copper is deposited within a damascene opening and then polished such as by chemical mechanical polishing (CMP) to leave the copper only within the opening. For well-controlled copper CMP performance, dummy metal lines are added in every metal layer for 90 nm and below geometry. This increases the difficulty of failure mode analysis since the metal cannot be removed by dry etching. The conventional method to prepare a wafer for failure mode analysis is to use wet etching to remove the intermetal dielectric layer (IMD) and then to use ACE vibration to remove the metal.

As devices shrink to 90 nm or below, it is desirable to use ultra low dielectric constant (k) dielectric material (k<4.5 and preferably less than 3.0) as the IMD layer in order to reduce Rc delay. However, these ultra low-k films are difficult to remove using the current wet etch solution. It is desired to find a method to easily remove the ultra low-k films for failure mode analysis. Also, as devices shrink to 90 nm or below and using ultra low dielectric constant material as the IMD layer, the adhesion between conductive materials and the low dielectric constant materials is not sufficient for integrated circuit usage. Therefore, an optimized surface roughness of the low dielectric constant material before filling conductive material is crucial, especially for thermal stress release and electron migration issues.

U.S. Pat. No. 6,596,467 to Gallagher et al describes a low-k dielectric material having a removable porogen. The porogen is removed after metal planarization.

The papers "Surface roughness and surface-induced resistivity of gold films on mica: influence of the theoretical modelling of electron-surface scattering" by Ra'ul C. Munoz et al, *J. Phys.: Condens. Matter* 12 (2000) L379–L385; "Increase in Electrical Resistivity of Copper and Aluminum Fine Lines" by Yuko Hanaoka, et al, *Materials Transactions*, Vol. 43, No 7 (2002) pp. 1621–1623; and "Polyetheretherketone (PEEK) Surface Functionalization by Low-Energy Ion-Beam Irradiation under a Reactive $O_2$ Environment and Its Effect on the PEEK/Copper Adhesives" by and Sehyun Kim, Ki-Jun Lee, and Yongsok Seo, *Langmuir*, 20 (1), 157–163, 2004 discuss a roughened surface as important for a compromised adhesive capability and the resistance of the conductor layer.

SUMMARY OF THE INVENTION

It is the object of this invention to provide a method for improving failure mode analysis.

It is another object of this invention to provide a method for easily removing a low dielectric constant dielectric material for failure mode analysis.

It is a further object of this invention to provide a method for easily removing a porous low dielectric constant dielectric material for failure mode analysis.

Yet another object is to provide an opening in a porous dielectric material having a conductor embedded in the opening wherein the interface between the dielectric and the conductor has roughness.

In accordance with the foregoing and other objects of the present invention, a method of removing a dielectric material for failure mode analysis is achieved. A substrate is provided having semiconductor device structures formed in and on the substrate. The semiconductor device structures comprise conductor layers embedded in openings in dielectric layers having a dielectric constant of less than 4.5. The integrated circuit structure is prepared for failure analysis by removing the low dielectric constant dielectric layers and exposing the conductor layers for further failure analysis by optical examination or scanning electron microscope (SEM).

Also in accordance with the objects of the invention, an integrated circuit structure is provided comprising a dielectric layer on a substrate and a conductor layer embedded in an opening in the dielectric layer and overlying a barrier layer deposited within the opening wherein the dielectric layer has a roughness between the dielectric and the conductor wherein the roughness of the dielectric layer divided by the thickness of the barrier layer is 0 to 1.

BRIEF DESCRIPTION of THE DRAWINGS

In the accompanying drawings forming a material part of this description, there is shown.

DETAILED DESCRIPTION of THE PREFERRED EMBODIMENTS

An enhanced surface adhesion between conductor layer and dielectric layer method is described with reference to FIGS. 1–4. An ultra low-k film containing a porogen is used. A new wet etch solution has been developed to remove this ultra low-k film or to roughen the surface of the ultra low-k film to provide a good adhesion.

Figure 1:
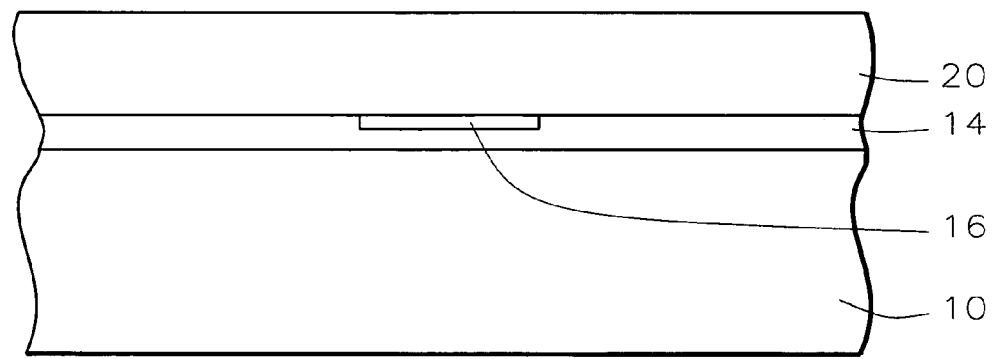
FIGS. 1 through 4 are schematic cross-sectional representations of a preferred embodiment of the present invention.

Referring now to FIG. 1, there is illustrated a partially completed integrated circuit device. Semiconductor substrate 10 is illustrated. Semiconductor devices such as MOSFETs, not shown, are formed in and on the semiconductor substrate, as is conventional in the art. These devices are contained within the layer 14. Also within the layer 14 is a device 16 to be contacted by a copper line to be fabricated subsequently. An ultra-low dielectric constant material layer 20 is formed over the layer 14. The dielectric constant of the layer 20 will be less than 4.5, and preferably between 1.7 and 4.5. The dielectric material is selected from the group containing silicon, carbon, oxygen, and fluorine and the combination of any of these materials; for example, silicon oxide, silicon oxide fluorine, silicon carbine, silicon carbine oxide, silicon carbine fluorine, and so on. A conventional deposition method for the dielectric material is plasma containing chemical vapor deposition such as PECVD or HDP-CVD. However, other deposition techniques such as atomic layer deposition, spin-on-coating, low temperature chemical deposition, or low pressure chemical deposition are candidates for low-k dielectric film deposition.

Figure 2:
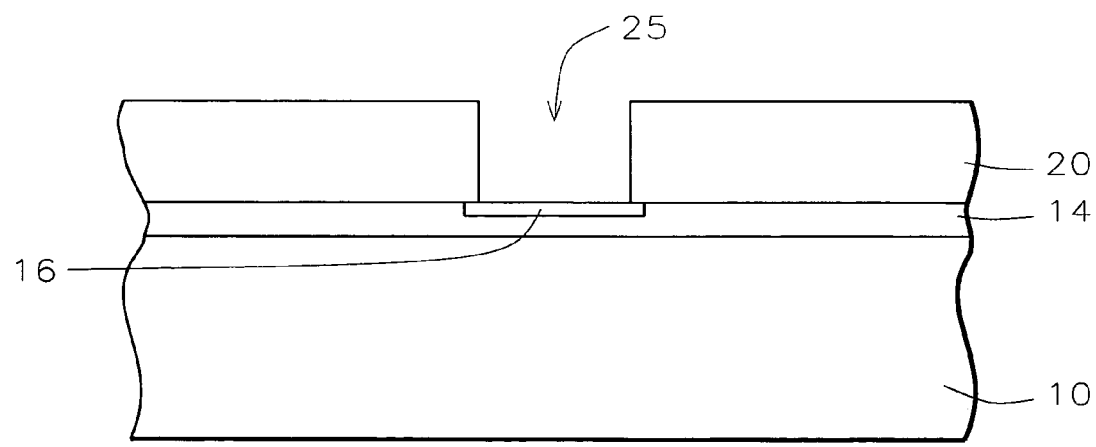

Referring now to FIG. 2, the dielectric layer 20 is etched using either a wet etching process or a dry etching process to form a damascene opening 25 to the device to be contacted 16. For the wet etching process, the opening 25 can be formed by using an $NH_4+$ containing solvent such as ($NH_4F+HF+CH_3COOH$) with a mask layer (conventionally a photoresist layer). In the dry etching process, the opening 25 can be formed by using a gaseous etchant containing a perfluorocarbon having a carbon:fluorine atomic ratio at least about 1:3, such as $C_2F_6$, $C_3F_5$, or $C_4F_8$ with a mask layer.

Figure 3:
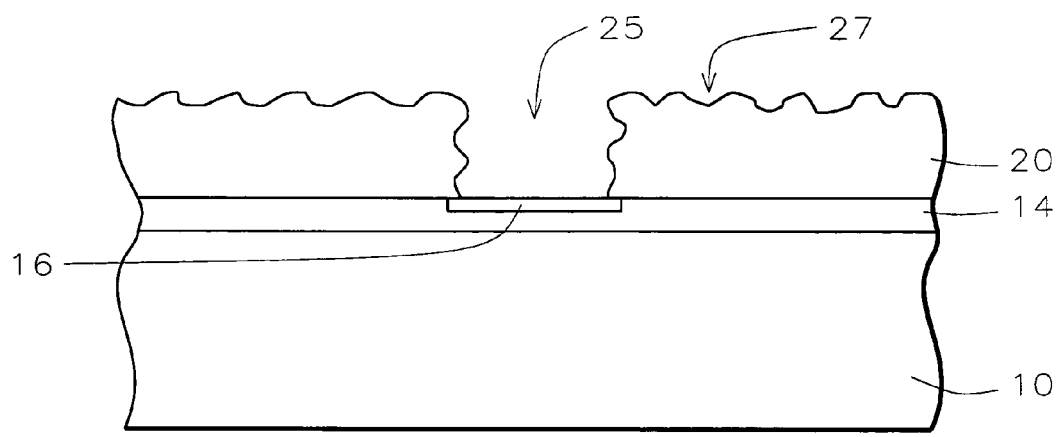

Now, an adhesion enhancement step is added. The wafer is exposed in an environment containing $NH_4+$ such as by dipping the wafer in a solution containing $NH_4F$. The environment should be at a temperature of between about 20 and 410° C. The ion concentration should be between about 0.2 and 8M. Exposure time is between about 3 seconds and 350 seconds. The resulting roughened surface 27 is shown in FIG. 3. This additional step to roughen the surface after the opening is etched is favored. However, using an etchant gas containing $NH_4F$ to form the opening would have a similar effect.

Figure 5:
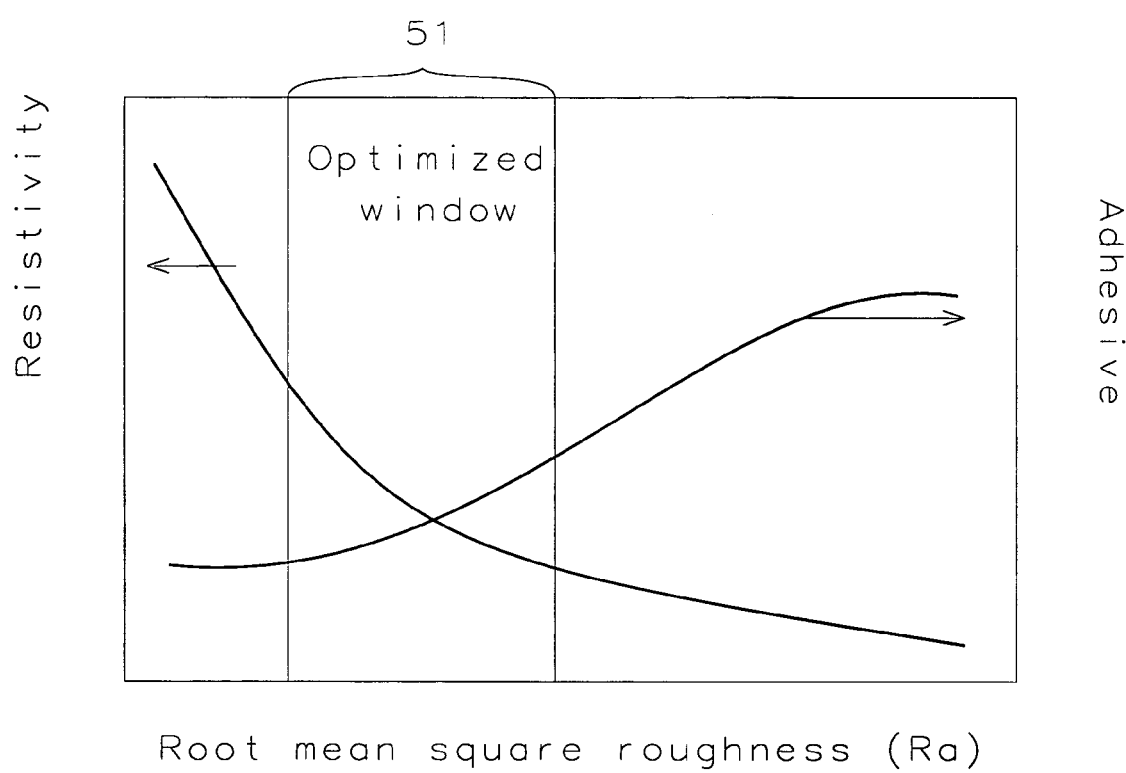
FIG. 5 is a graphical representation of resistivity and adhesive strength as functions of surface roughness.

Roughening a portion of the dielectric layer will enhance the adhesion between the dielectric layer and subsequent conductor layer, or barrier layers. Providing an optimized portion of a rough surface is important for a compromised adhesive capability and the resistance of the conductor layer. A higher surface roughness of the dielectric layer will result in a high resistance of the subsequently deposited conductor due to free electrons scattering from the rough interface, while a smooth surface reduces the surface tension between the subsequent conductor layer or dielectric layer, and hence, reduces the adhesive capability between the two materials. FIG. 5 shows an optimized window 51 to achieve a sound process region for successful manufacturing.

Surface bombardment by particle beams or pulsed laser melting is also a preferred approach for surface roughening. To achieve a sufficient surface roughness for adhesion enhancement, the energy and exposure of particle beams are crucial. For example, a kinetic energy of no less than 300 eV will result in a surface roughness (fluorine doped dielectric) of about 50 A at an exposure of about 15 sec when Ar is used. The roughness is not only dependent on the kinetic energy and the exposure, but also on the specie of particle and the surface of dielectric materials. For manufacturing cost concern, Ar and nitrogen would be the most useful species for surface roughening; however, carbon, carbon oxide (CO), carbon dioxide ($CO_2$), or oxygen, or the combinations thereof is preferred for dielectric constant reduction. Even thermal hydrogen will result in a uniform surface roughness of the exposed dielectric layer.

Figure 4:
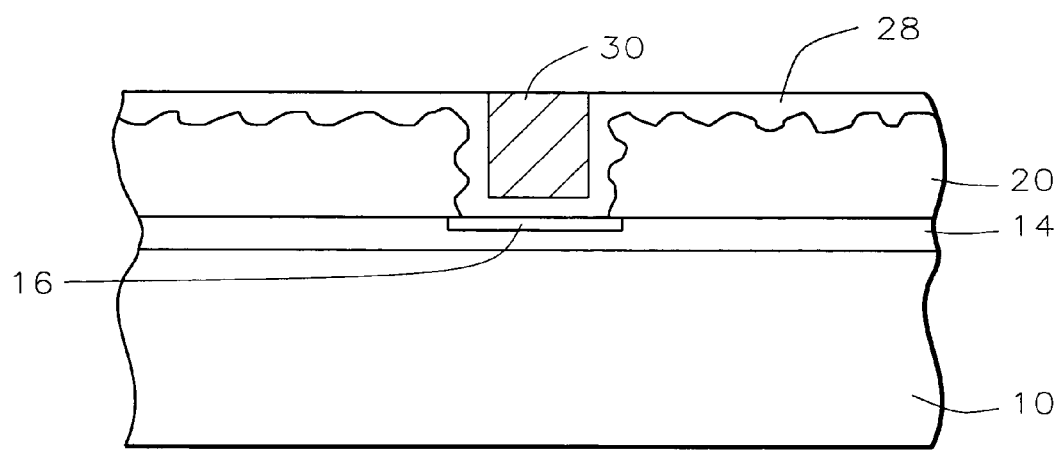

Now, a barrier layer 28 is deposited over the dielectric layer and within the damascene opening, as shown in FIG. 4. For example, the barrier layer may comprise titanium, titanium nitride, tantalum, tantalum nitride, or a glassy metal such as PdN, or a combination thereof, having a thickness of between about 50 and 350 Angstroms. The mean roughness of the surface of the dielectric layer (Ra) is less than 150 Angstroms or related to the thickness t of the barrier layer, Ra/t=0 to 1. Preferably, Ra/t=0.02 to 0.05 to optimize resistance of the subsequently deposited conductor and the adhesive capability between the ultra low-k dielectric and the barrier layer.

The definition of mean roughness of surface is given by:

$$R_a = \frac{1}{l}\int_0^l |f(x)|dx,$$

where l is the length of the sample measured and f(x) is a topography function of the sample surface measured.

A conductor layer, such as copper, is deposited into the damascene opening and polished back to form the conductor layer 30 embedded in the opening 25, as shown in FIG. 4.

While the present invention has been particularly shown and described with reference to the preferred embodiment thereof, it will be understood by those skilled in the art that various changes in form and detail may be made without departing from the spirit and scope of the invention.

The invention claimed is:

1. A method for fabricating an integrated circuit structure comprising:
   providing a substrate having semiconductor device structures formed in and on said substrate;
   forming a dielectric layer overlying said semiconductor device structures;
   forming an opening through said dielectric layer to one of said semiconductor device structures;
   roughening a portion of the surface of said dielectric layer after forming said opening; and
   after roughening the surface of said dielectric layer, filling said opening with a conductor layer followed by subsequent processes to complete fabrication of said integrated circuit structure.

2. The method according to claim 1 wherein said dielectric layer is a composite dielectric layer comprising silicon, carbon, fluorine, or oxygen, or combinations thereof.

3. The method according to claim 1 wherein said dielectric layer further comprises a low dielectric constant dielectric layer having a dielectric constant of between about 1.7 and 4.5.

4. The method according to claim 1 wherein said roughening the surface of said dielectric layer comprises dipping said integrated circuit structure in an ionized solution.

5. The method according to claim 4 wherein said ionized solution contains NH4+ ions.

6. The method according to claim 1 wherein said roughening the surface of said dielectric layer comprises dipping said integrated circuit structure in an ionized solution for between about 3 seconds and 350 seconds.

7. The method according to claim 1 wherein said roughening the surface of said dielectric layer comprises dipping said integrated circuit structure in a solution containing NH4+ ions for between about 3 seconds and 350 seconds.

8. The method according to claim 7 wherein said solution has a temperature of between about 20 and 450. degree. C.

9. The method according to claim 1 wherein said roughening the surface of said dielectric layer comprises exposing said integrated circuit structure in an environment containing NH4+ ions for between about 3 seconds and 350 seconds.

10. The method according to claim 9 wherein said environment has a temperature of between about 20 and 450. degree. C.

11. The method according to claim 1 wherein said roughening the surface of said dielectric layer is performed by particle beams bombardment to said integrated circuit structure, said particle beams having kinetic energy of no less than 300 eV.

12. The method according to claim 11 wherein said particle beams comprise elements selected from the group consisting of argon, helium, nitrogen, hydrogen, oxygen and carbon, and the combinations thereof.

13. The method according to claim 1 wherein said roughening the surface of said dielectric layer is performed by a thermal hydrogen containing environment to treat said integrated circuit structure.

14. The method according to claim 1 wherein said conductor layer further comprises a baffler layer on said roughened surface of said dielectric layer.

15. The method according to claim 14 wherein the mean roughness of said roughened surface of said dielectric layer divided by a thickness of baffler layer is between 0 and 1.

16. The method according to claim 14 wherein the mean roughness of said roughened surface of said dielectric layer divided by a thickness of said barrier layer is between 0.02 and 0.025.

17. The method according to claim 1 wherein the mean roughness of said roughened surface of said dielectric layer is less than 150 Angstroms.

18. A method for failure analysis of an integrated circuit structure comprising:
  providing a substrate having semiconductor device structures formed in and on said substrate;
  forming a dielectric layer overlying said semiconductor device structures; forming an opening through said dielectric layer to one of said semiconductor device structures;
  roughening a portion of the surface of said dielectric layer after forming said opening;
  after roughening the surface of said dielectric layer, filling said opening with a conductor layer to complete fabrication of said integrated circuit structure; and
  thereafter preparing said integrated circuit structure for said failure analysis by removing said dielectric layer and exposing said conductor layer.

19. The method according to claim 18 wherein said dielectric layer comprises silicon, carbon, fluorine, or oxygen, or combinations thereof.

20. The method according to claim 18 wherein said dielectric layer further comprises a low dielectric constant dielectric layer having a dielectric constant of between about 1.7 and 4.5.

21. The method according to claim 18 wherein said roughening the surface of said dielectric layer comprises dipping said integrated circuit structure in a solution containing NH4+ ions for between about 3 seconds and 350 seconds.

22. The method according to claim 21 wherein said solution has a temperature of between about 20 and 450. degree. C.

23. The method according to claim 18 wherein said roughening the surface of said dielectric layer comprises exposing said integrated circuit structure in an environment containing NH4+ ions for between about 3 seconds and 350 seconds.

24. The method according to claim 23 wherein said environment has a temperature of between about 20 and 450. degree. C.

25. The method according to claim 18 wherein said conductor layer further comprises a baffler layer on said roughened surface of said dielectric layer.

26. The method according to claim 25 wherein the mean roughness of said roughened surface of said dielectric layer divided by a thickness of said baffler layer is between 0 and 1.

27. The method according to claim 25 wherein the mean roughness of said roughened surface of said dielectric layer divided by a thickness of said barrier layer is between 0.02 and 0.025.

28. The method according to claim 18 wherein the mean roughness of said roughened surface of said dielectric layer is less than 150 Angstroms.

* * * * *